(12) United States Patent
Park (10) Patent No.: US 7,649,250 B2
(45) Date of Patent: Jan. 19, 2010

(54) SEMICONDUCTOR PACKAGE

(75) Inventor: Tae-Sung Park, Chungcheongnam-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 60 days.

(21) Appl. No.: 11/940,178

(22) Filed: Nov. 14, 2007

(65) Prior Publication Data

US 2008/0111229 A1    May 15, 2008

(30) Foreign Application Priority Data

Nov. 14, 2006    (KR) .................... 10-2006-0112372

(51) Int. Cl.
*H01L 23/48* (2006.01)
*H01L 23/52* (2006.01)
*H01L 23/495* (2006.01)
*H01L 23/02* (2006.01)

(52) U.S. Cl. ............... 257/690; 257/666; 257/676; 257/678; 257/691; 257/E23.037; 257/E23.04; 257/E23.061; 257/E23.178; 257/E23.185; 257/E23.189; 257/E23.19

(58) Field of Classification Search ............... 257/666, 257/676, 678, 690–691, 778, E23.037, E23.04, 257/E23.061, E23.178, E23.185, E23.189, 257/E23.19

See application file for complete search history.

(56) References Cited

U.S. PATENT DOCUMENTS

| 5,888,884 | A | 3/1999 | Wojnarowski | 438/462 |
|---|---|---|---|---|
| 6,344,401 | B1 * | 2/2002 | Lam | 438/460 |
| 6,774,499 | B1 * | 8/2004 | Yang | 257/786 |
| 7,145,228 | B2 * | 12/2006 | Yean et al. | 257/698 |
| 7,154,173 | B2 * | 12/2006 | Ikeda et al. | 257/704 |
| 7,169,691 | B2 * | 1/2007 | Doan | 438/598 |
| 7,170,167 | B2 * | 1/2007 | Hsuan et al. | 257/734 |
| 7,193,303 | B2 * | 3/2007 | Wu | 257/678 |
| 7,329,949 | B2 * | 2/2008 | Jiang et al. | 257/723 |

(Continued)

FOREIGN PATENT DOCUMENTS

KR    1998-058476    10/1998

(Continued)

OTHER PUBLICATIONS

English language abstract of Korean Publication No. 1998-058476.

(Continued)

*Primary Examiner*—Ida M Soward
(74) *Attorney, Agent, or Firm*—Myers Bigel Sibley & Sajovec (57) ABSTRACT

Provided are a semiconductor package and a method for manufacturing the same. The semiconductor package includes: a substrate having a top surface on which a lead is formed and a bottom surface opposite to the top surface; a semiconductor chip attached to the top surface of the substrate and having an active surface on which a chip pad is formed and a back surface opposite to the active surface; a redistribution pattern electrically connected to the chip pad and extending from the active surface to a lateral surface of the semiconductor chip; and an interconnector electrically connecting the redistribution to the lead on the lateral surface of the semiconductor chip.

14 Claims, 7 Drawing Sheets

U.S. PATENT DOCUMENTS

| | | | |
|---|---|---|---|
| 7,352,054 B2 * | 4/2008 | Jobetto | 257/673 |
| 7,394,152 B2 * | 7/2008 | Yu et al. | 257/690 |
| 7,473,989 B2 * | 1/2009 | Yang et al. | 257/678 |
| 7,572,725 B2 * | 8/2009 | Storli | 438/612 |
| 2002/0140069 A1 * | 10/2002 | Lee et al. | 257/678 |
| 2005/0082651 A1 * | 4/2005 | Farnworth et al. | 257/678 |
| 2005/0212132 A1 * | 9/2005 | Hsuan et al. | 257/738 |
| 2006/0275949 A1 * | 12/2006 | Farnworth et al. | 438/106 |
| 2008/0111228 A1 * | 5/2008 | Yu et al. | 257/690 |

FOREIGN PATENT DOCUMENTS

| | | |
|---|---|---|
| KR | 10-2001-0018694 | 3/2001 |
| KR | 10-2004-0024163 | 3/2004 |

OTHER PUBLICATIONS

English language abstract of Korean Publication No. 10-2001-0018694.

* cited by examiner

Fig. 1

(CONVENTIONAL ART)

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2006-112372, filed on Nov. 14, 2006, the entire contents of which are hereby incorporated by reference.

BACKGROUND

1. Technical Field

The present invention relates to a semiconductor package and a method for manufacturing the same, and more particularly, to a semiconductor package, which can be made lightweight, slim, and compact, and a method for manufacturing the same.

2. Description of the Related Art

In a conventional semiconductor package, a semiconductor chip is attached to a substrate. The semiconductor chip is electrically connected to the substrate through bonding wires. An insulator prevents the bonding wires and the semiconductor chip from contamination and moisture. The semiconductor package includes solder balls on a bottom surface of the substrate. The solder balls serve as input/output terminals for the semiconductor package.

Figure 1:
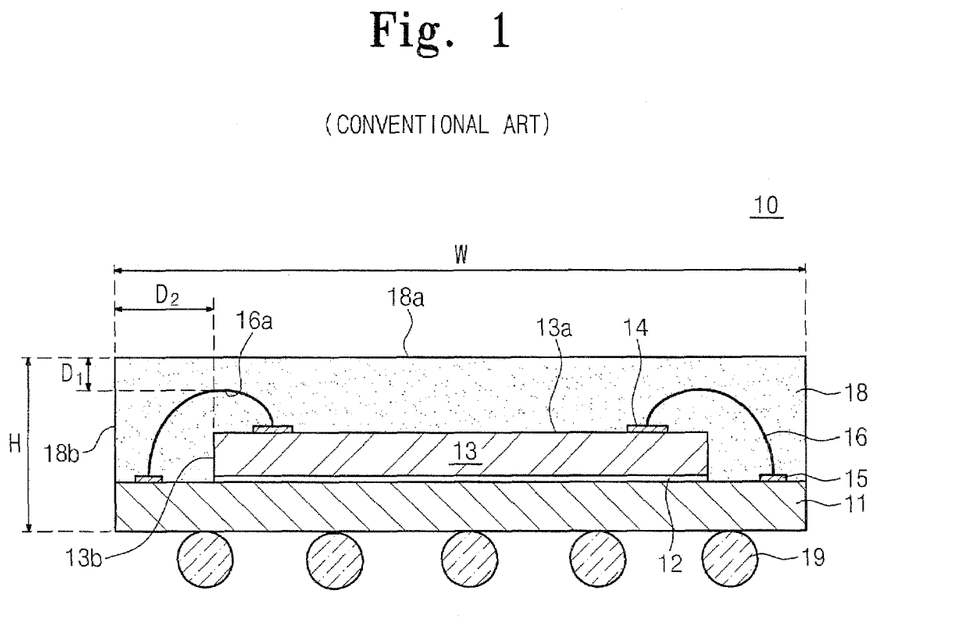
FIG. 1 is a cross-sectional view of a conventional semiconductor package.

FIG. 1 is a cross-sectional view of a conventional semiconductor package 10. Referring to FIG. 1, the semiconductor package 10 includes a semiconductor chip 13 attached to a printed circuit board (PCB) 11 through an adhesive 12. Pads 15 formed on the PCB 11 and pads 14 formed on the semiconductor chip 13 are mutually connected through bonding wires 16 to electrically connect the PCB 11 to the semiconductor chip 13. A plurality of solder balls 19 serving as external connection terminals are attached to the PCB 11. The semiconductor chip 13 is encapsulated by an insulator 18 to provide protection from the external environment.

As described above, typically, the PCB 11 is electrically connected to the semiconductor chip 13 through the bonding wires 16. When using a wire bonding technology, the highest point 16a of the bonding wires 16 must be spaced from a top surface 18a of the insulator 18 by a predetermined distance $D_1$ in order to ensure the bonding wires 16 do not protrude from the insulator 18. The distance $D_1$ has an effect on a total height H of the semiconductor package 10 and also the capability of stacking of multiple semiconductor packages 10. Hence, there are limitations in reducing the weight and dimensions of the semiconductor package 10.

In addition, lateral surfaces 13b of the semiconductor chip 13 must be spaced from lateral surfaces 18b of the insulator 18 by a predetermined distance $D_2$, i.e., a distance necessary for connecting the semiconductor chip 13 to the PCB 11. The distance $D_2$ has an effect on the width W of the semiconductor package 10. Hence, there is a further limitation in reducing the size of the semiconductor package 10.

As described above, the semiconductor package 10 has a limitation in reducing its height H and width W due to the bonding wire 16. Therefore, there is a limitation in realizing light weight, slimness, and compactness of the semiconductor package 10 while fabricating the semiconductor package 10. The present invention addresses these and other disadvantages of the conventional art.

SUMMARY

The present invention provides a semiconductor package, which can be made lightweight, slim, and compact, and a method for manufacturing the same. The present invention also provides a semiconductor package in which a semiconductor chip is electrically connected to a printed circuit board (PCB) using a redistribution technology without using a bonding wire, which provides a smaller semiconductor package, and a method for manufacturing the same.

Embodiments of the present invention provide semiconductor packages including: a substrate having a top surface on which a lead is formed and a bottom surface opposite to the top surface; a semiconductor chip attached to the top surface of the substrate and having an active surface on which a chip pad is formed and a back surface opposite to the active surface; a redistribution pattern electrically connected to the chip pad and extending from the active surface to a lateral surface of the semiconductor chip; and an interconnector electrically connecting the redistribution pattern to the lead on the lateral surface of the semiconductor chip.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION

Hereinafter, a semiconductor package and a method for manufacturing the same will be described in detail with reference to the accompanying drawings.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout the drawings.

Figure 2A:
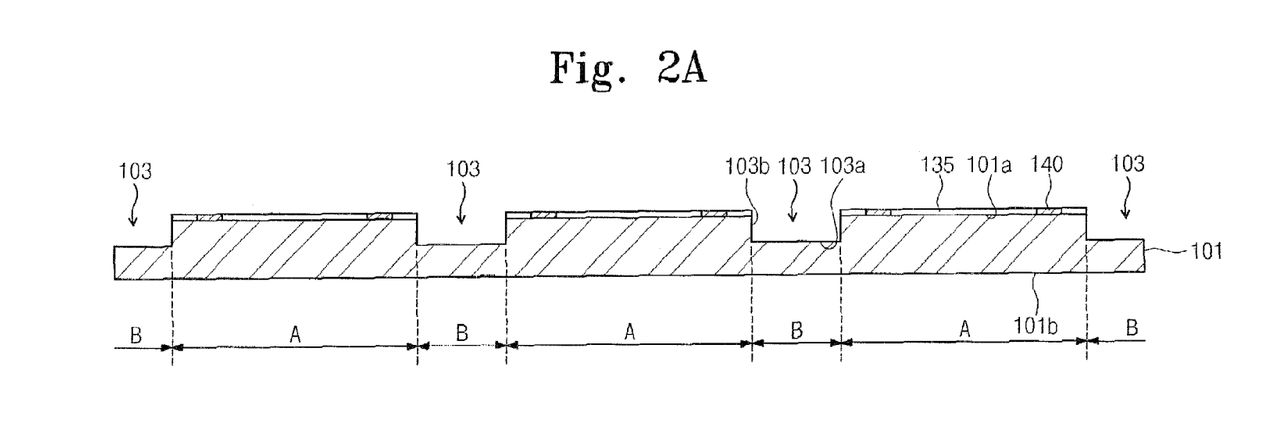
FIGS. 2A through 2G are cross-sectional views illustrating a method for manufacturing a semiconductor package according to a first embodiment of the present invention.
Figure 2B:
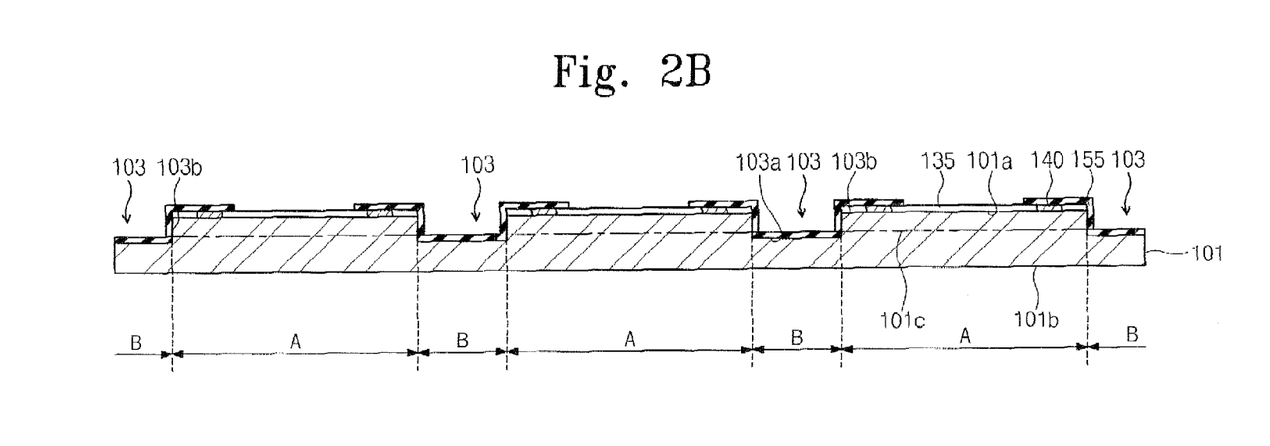
Figure 2C:
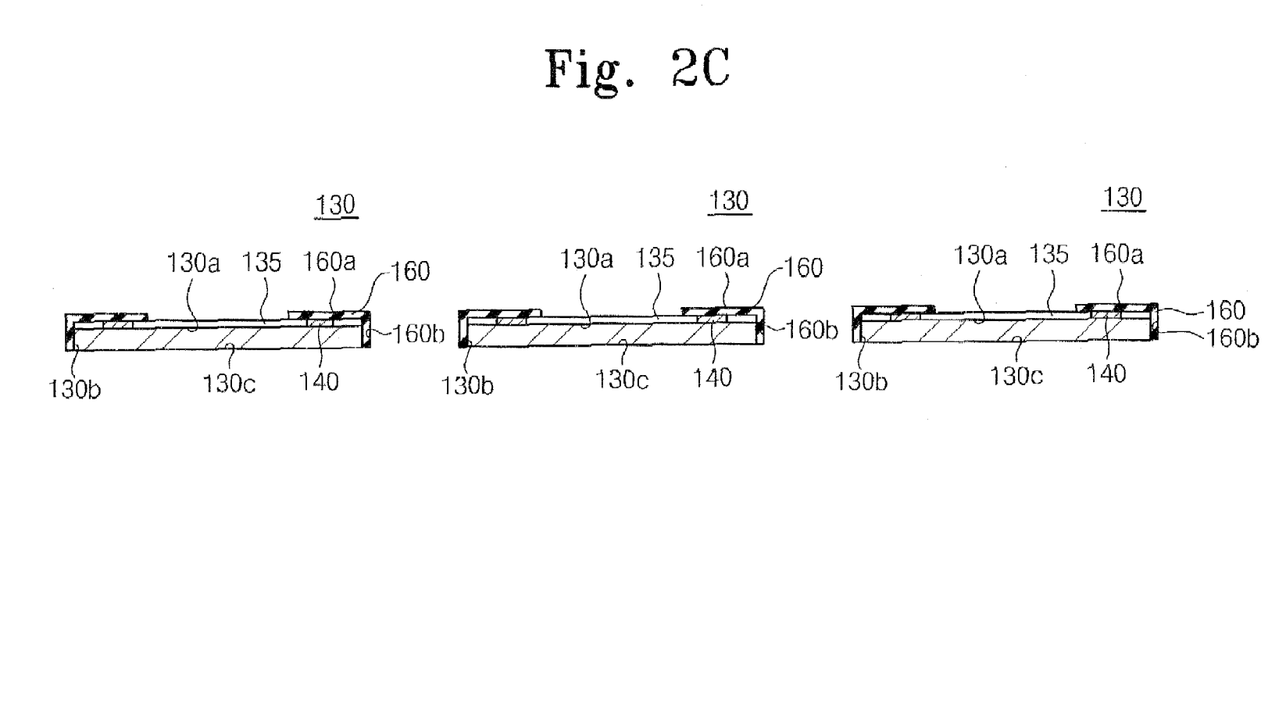
Figure 2D:
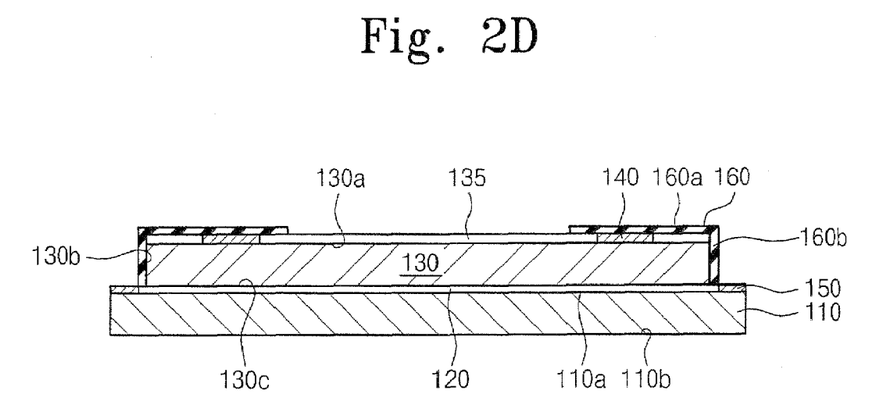
Figure 2E:
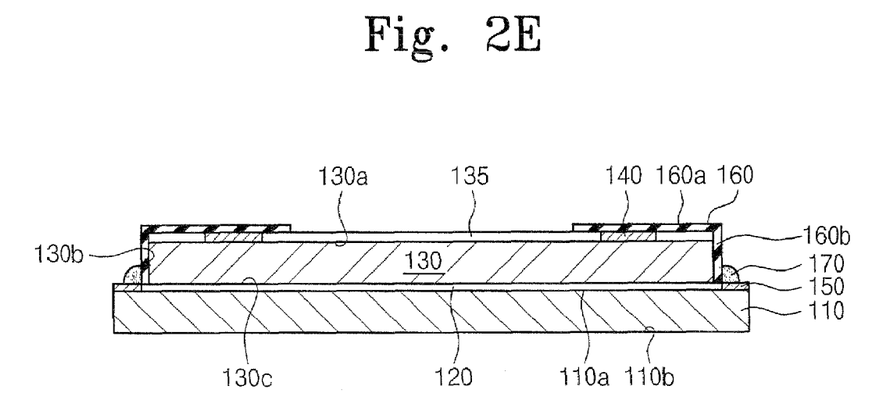
Figure 2F:
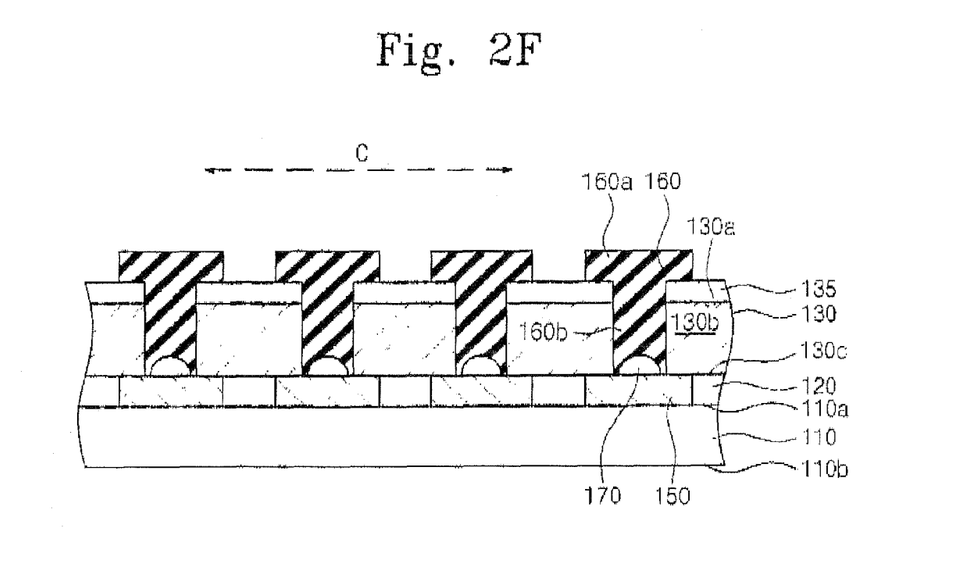

FIGS. 2A through 2G are cross-sectional views illustrating a method for manufacturing a semiconductor package according to a first embodiment of the present invention. FIG. 2F is an enlarged sectional view of the side of FIG. 2E.

Referring to FIG. 2A, a substrate 101 is prepared. The substrate 101 may be, e.g., a semiconductor substrate 101 such as a silicon wafer. The semiconductor substrate 101 has a top surface 101a and a bottom surface 101b opposite to the top surface 101a. A plurality of chip pads 140 and a plurality of circuit patterns (not shown) are formed on the top surface 101a. The semiconductor substrate 101 is divided into chip regions A and sawing regions B. The chip regions A will be individual semiconductor chips respectively following subsequent processes. The chip regions A are separated from each other by the individual sawing regions B that are to be removed by a sawing process. A passivation layer 135 protecting the chip pads 140 and the circuit patterns against the outside environment is formed on the top surface 101a of the semiconductor substrate 101. Sawing grooves 103 are formed by removing the semiconductor substrate 101 to a predetermined depth from the top surface 101a toward the bottom surface 101b of the semiconductor substrate 101. The sawing grooves 103 may be formed by a well-known process, e.g., a blade or laser process. Each of the sawing grooves 103 has lateral surfaces 103b and a bottom surface 103a.

Referring to FIG. 2B, a conductive material is deposited and patterned to form conductive patterns 155 on a portion of the top surface 101a of the semiconductor substrate 101 and the bottom surfaces 103a and the lateral surfaces 103b of the sawing grooves 103. Alternatively, the conductive patterns 155 may be formed on the entire top surface 101a of the semiconductor substrate 101. An insulating layer may be formed in the sawing grooves 103 prior to depositing the conductive material in order to isolate the conductive patterns 155 from the semiconductor substrate 101. The conductive patterns 155 are electrically connected to the chip pads 140 formed on the top surface of the semiconductor substrate 101 during the forming of the conductive patterns 155.

A portion of the semiconductor substrate 101 is removed from the bottom surface 101b of the semiconductor substrate 101 up to a removal surface 101c after the forming of the conductive patterns 155. The portion of the semiconductor substrate 101 may be removed by a well-known back lap process. A height of the removal surface 101c is equal to or greater than those of the bottom surfaces 103a of the sawing grooves. That is, the semiconductor substrate 101 is removed from the bottom surface 101b of the semiconductor substrate 101 up to the bottom surfaces 103a of the sawing grooves 103.

Referring to FIG. 2C, the semiconductor substrate 101 of FIG. 2B is separated into individual semiconductor chips 130 by the above processes. At the same time, portions of the conductive patterns 155 are also removed to form redistribution patterns 160. The semiconductor chip 130 has an active surface 130a, lateral surfaces 130b, and a back (or inactive) surface 130c. The active surface 130a of the semiconductor chip 130 is a portion of the top surface 101a of FIG. 2B of the semiconductor substrate 101 of FIG. 2B. The chip pads 140 and the passivation layer 135 are disposed on the active surface 130a, and the redistribution patterns 160 electrically connected to the chip pads 140 are disposed on portions of the active surface 130a and the lateral surfaces 130b. The redistribution pattern 160 is divided into a horizontal portion 160a and a vertical portion 160b. The horizontal portion 160a is formed on the active surface 130a. The vertical portion 160b is formed on the lateral surface 130b and extends from the horizontal portion 160a. That is, the redistribution pattern 160 extends from the chip pad 140, along the active surface 130a and down the lateral surface 130b.

Referring to FIG. 2D, the semiconductor chip 130 is attached to the substrate 110 using an adhesive 120. The substrate 110 is a chip carrier, e.g., a printed circuit board (PCB) 110. The PCB 110 has a top surface 110a to which the semiconductor chip 130 is attached and a bottom surface 110b opposite to the top surface 110a. Substrate leads 150 formed of a conductive material are formed on the top surface 110a of the PCB 110. The adhesive 120 is interposed between the back surface 130c of the semiconductor chip 130 and the top surface 110a of the PCB 110. That is, the semiconductor chip 130 is attached to the PCB 110 so that the back surface 130c of the semiconductor chip 130 is opposite to the top surface 110a of the PCB 110. The substrate leads 150 are adjacent to the vertical portions 160b of the redistribution patterns 160. The vertical portions 160b are formed on the lateral surfaces 130b of the semiconductor chip 130.

Referring to FIG. 2E, interconnectors 170 are formed between the vertical portions 160b of the redistribution patterns 160 and the substrate leads 150. The redistribution patterns 160 are electrically connected to the substrate leads 150 through the interconnectors 170. Hence, the semiconductor chip 130 is electrically connected to the PCB 110. The interconnector 170 may be formed in a solder or stud bump type. Alternatively, the interconnector 170 may be formed in a wire type.

Referring to FIG. 2F, as described above, the redistribution pattern 160 includes the horizontal portion 160a and the vertical portion 160b. The horizontal portion 160a is formed on the active surface 130a of the semiconductor chip 130 on which the passivation layer 135 is formed. The vertical portion 160b is formed on the lateral surface 130b of the semiconductor chip 130 and extends from the horizontal portion 160a. The vertical portion 160b is electrically connected to the substrate lead 150 through the interconnector 170. The substrate lead 150 is disposed on the top surface 110a of the PCB 110. The semiconductor chip 130 is attached to the top surface 110a of the PCB 110 by the adhesive 120. A plurality of redistribution patterns 160 and a plurality of substrate leads 150 may be arranged in a left and right direction C.

Figure 2G:
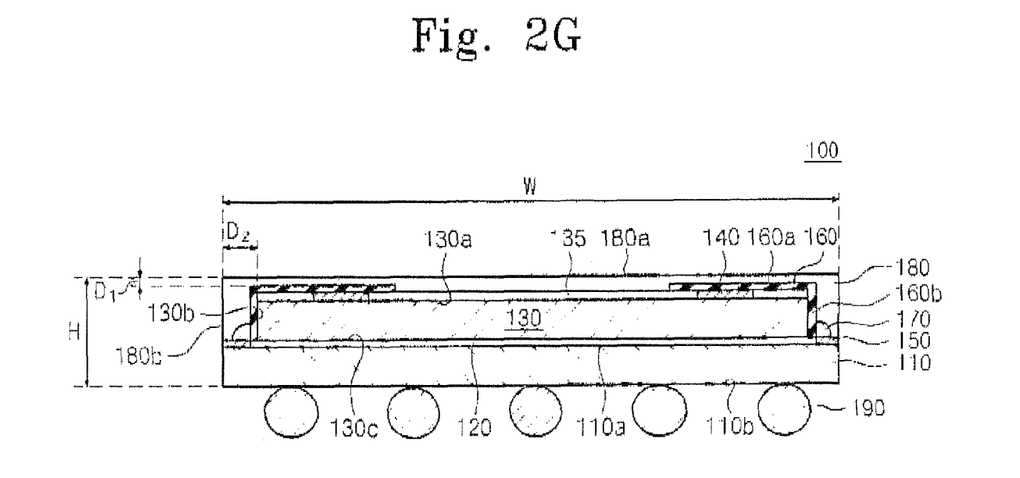

Referring to FIG. 2G, an insulator 180 is formed on the substrate 110 to encapsulate the semiconductor chip 130. The insulator 180 serving as an encapsulant protects the semiconductor chip 130 against external impact, contamination, or other various environmental hazards. A plurality of external connection terminals 190, e.g., solder balls, are formed on the bottom surface 110b of the PCB 110. Thereby, the semiconductor package 100 is completed.

In the semiconductor package 100 formed through the sequence of processes described above, a distance $D_1$ between a top surface 180a of the insulator 180 and the horizontal portion 160a of the redistribution pattern 160 can be greatly reduced compared to that of the conventional semiconductor package (see FIG. 1). Hence, a total height H of the semiconductor package 100 is greatly reduced. In addition, a distance $D_2$ necessary for electrically connecting the semiconductor chip 130 to the PCB 110, i.e., a distance $D_2$ between the lateral surface 130b of the semiconductor chip 130 and a lateral surface 180b of the insulator 180, can also be greatly reduced compared to that of the conventional semiconductor package (see also FIG. 1). Hence, the total width W of the semiconductor package 100 is greatly reduced to allow the semiconductor package 100 to be made compact.

Figure 3A:
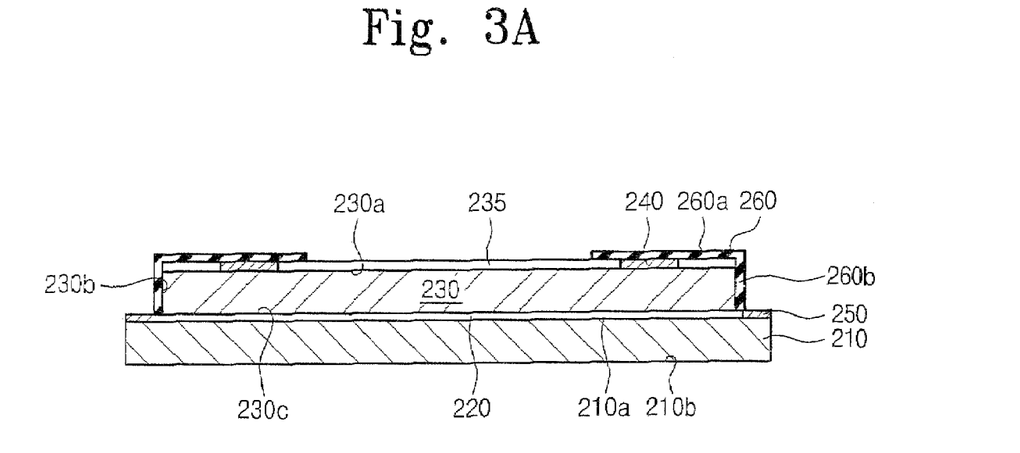
FIGS. 3A through 3C are cross-sectional views illustrating a method for manufacturing a semiconductor package according to a second embodiment of the present invention.
Figure 3B:
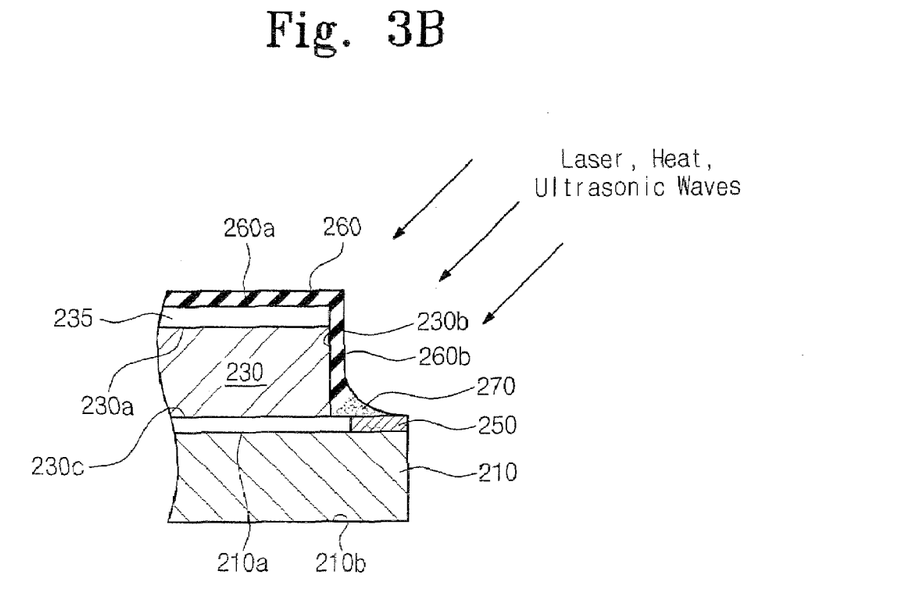
Figure 3C:
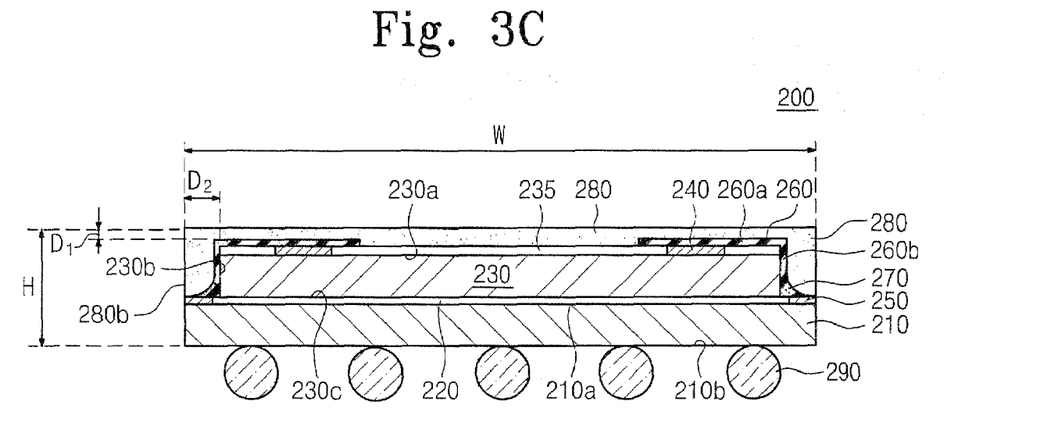

FIGS. 3A through 3C are cross-sectional views illustrating a method for manufacturing a semiconductor package according to a second embodiment of the present invention. Since the second embodiment is similar to the first embodiment, different portions between the embodiments will be mainly described below to avoid redundancy, and therefore an explanation of corresponding features will be described briefly or omitted.

Referring to FIG. 3A, in the semiconductor package according to the second embodiment of the present invention, a semiconductor chip 230 is attached to the PCB 210 by an adhesive 220. The PCB 210 has a top surface 210a on which the semiconductor chip 230 is mounted and a bottom surface 210b opposite to the top surface 210a. Substrate leads 250 are formed on the top surface 210a of the PCB 210. The semiconductor chip 230 has a back surface 230c facing the top surface 210a of the PCB 210, an active surface 230a opposite to the back surface 230c, and lateral surfaces 230b. Chip pads 240 and a passivation layer 235 are formed on the active surface 230a of the semiconductor chip 230. Redistribution patterns 260 electrically connected to the chip pads 240 are formed on the active surface 230a of the semiconductor chip 230. The redistribution patterns 260 are divided into horizontal portions 260a and vertical portions 260b. The horizontal portions 260a are electrically connected to the chip pads 240, respectively. The vertical portions 260b formed on the lateral surfaces 230b of the semiconductor chip 230 extend from the horizontal portions 260a and are adjacent to the substrate leads 250.

Referring to FIG. 3B, the vertical portions 260b of the redistribution patterns 260 are fused to the substrate leads 250, respectively. The fusion between the redistribution pattern 260 and the substrate lead 250 can be accomplished by applying high temperature, irradiating a laser beam, or applying ultrasonic waves. An interconnector 270 is formed by fusing a portion of the vertical portion 260b of the redistribution pattern 260, or the portion of the vertical portion 260b and a portion of the substrate lead 250. The semiconductor chip 230 is electrically connected to the PCB 210 through the interconnector 270.

Referring to FIG. 3C, an insulator 280 protecting the semiconductor chip 230 is formed, and a plurality of external connection terminals 290 are attached to the bottom surface 210b of the PCB 210 to form a semiconductor package 200. In the semiconductor package 200, a distance D1 between a top surface 280a of the insulator 280 and the horizontal portions 260a of the redistribution patterns 160 is reduced, thereby significantly reducing a total height H of the semiconductor package 200. In addition, a distance $D_2$ between the lateral surface 230b of the semiconductor chip 230 and a lateral surface 280b of the insulator 280 is reduced, thereby significantly reducing a total width W of the semiconductor package 200.

As described above, according to the present invention, the semiconductor chip is electrically connected to the PCB using the redistribution technology without using a bonding wire in order to overcome technical limitations caused by using the typical bonding wire. Therefore, the limitation on the size of the semiconductor package, which is caused by using the bonding wire, is resolved or minimized such that the semiconductor package can be made lightweight, slim, and compact.

Embodiments of the present invention provide semiconductor packages including: a substrate having a top surface on which a lead is formed and a bottom surface opposite to the top surface; a semiconductor chip attached to the top surface of the substrate and having an active surface on which a chip pad is formed and a back surface opposite to the active surface; a redistribution pattern electrically connected to the chip pad and extending from the active surface to a lateral surface of the semiconductor chip; and an interconnector electrically connecting the redistribution pattern to the lead on the lateral surface of the semiconductor chip.

In some embodiments, the redistribution pattern includes a horizontal portion and a vertical portion, the horizontal portion being formed on the active surface of the semiconductor chip and being electrically connected to the chip pad, the vertical portion being formed on the lateral surface of the semiconductor chip, extending from the horizontal portion, and adjacent to the lead.

In other embodiments, the interconnector electrically connects the vertical portion of the redistribution to the lead. The interconnector includes one of a solder bump and a stud bump. The interconnector is formed by fusing the vertical portion of the redistribution and the lead.

In still other embodiments, the substrate further includes an insulator formed on the top surface of the substrate to encapsulate the semiconductor chip, and an external connection terminal formed on the bottom surface of the substrate.

In even other embodiments, the semiconductor packages further include an adhesive inserted between the top surface of the substrate and the back surface of the semiconductor chip to attach the semiconductor chip to the top surface of the substrate.

According to other embodiments of the present invention, methods for manufacturing semiconductor packages are provided, the methods including: providing a first substrate having a first top surface on which a chip pad is formed and a first bottom surface opposite to the first top surface; removing a portion of the first top surface to form a sawing groove; forming a conductive pattern on the first substrate; removing a portion of the first bottom surface to divide the first substrate into a plurality of semiconductor chips having a redistribution pattern constituted by a portion of the conductive pattern; mounting the semiconductor chips on a second substrate having a second top surface on which a lead is formed and a second bottom surface opposite to the second top surface; and forming an interconnector electrically connecting the lead to the redistribution in order to electrically connect the semiconductor chips to the second substrate.

In some embodiments, the dividing of the first substrate into the plurality of semiconductor chips includes: removing the portion of the first bottom surface so that a bottom surface of the sawing groove is removed and dividing the first substrate to form the plurality of semiconductor chips, the semiconductor chips having an active surface on which the chip pad is formed, a back surface opposite to the active surface, and lateral surfaces; and forming the redistribution pattern including a horizontal portion and a vertical portion, the horizontal portion being formed on the active surface of the semiconductor chips and electrically connected to the chip pad, the vertical portion being formed on the lateral surface of the semiconductor chips and extending from the horizontal portion.

In other embodiments, the mounting of the semiconductor chips includes disposing an adhesive between the back surface of the semiconductor chips and the second top surface of the second substrate to attach the semiconductor chips to the top surface of the second substrate.

In still other embodiments, the electrically connecting of the semiconductor chips to the second substrate includes forming one of a solder bump and a stud bump between the vertical portion of the redistribution pattern and the lead. The fusing of the vertical portion of the redistribution pattern and the lead uses one of heat, laser, and ultrasonic wave.

In even other embodiments, the semiconductor chip is electrically connected to the PCB using the redistribution technology without using a bonding wire in order to overcome technical limitations caused by using the typical bonding wire.

According to still other embodiments, a semiconductor package comprises: a substrate having a top surface on which a plurality of leads are disposed and a bottom surface opposite to the top surface; a semiconductor chip attached to the top surface of the substrate having an active surface on which a plurality of chip pads are disposed and a back surface opposite to the active surface; and a plurality of redistribution patterns electrically connected to the chip pad, each of the redistribution patterns including a horizontal portion extending on the active surface of the semiconductor chip and a vertical portion disposed on a lateral surface of the semiconductor chip, wherein each of the plurality of redistribution patterns is electrically connected to a corresponding one of the plurality of leads.

The semiconductor package may further comprise a plurality of interconnectors, the interconnectors electrically connecting the vertical portions of the redistribution patterns to the leads. The interconnectors may comprise one of a solder bump and a stud bump.

According to some embodiments, each of the plurality of redistribution patterns may be fused to the corresponding one of the plurality of leads.

The semiconductor package may further comprise an insulator disposed on the top surface of the substrate so as to encapsulate the semiconductor chip, and a plurality of external connection terminals disposed on the bottom surface of the substrate.

According to other embodiments, the semiconductor package may further comprise an adhesive disposed between the top surface of the substrate and the back surface of the semiconductor chip to adhere the semiconductor chip to the top surface of the substrate.

The semiconductor package may further include an insulating layer disposed between the vertical portions of the plurality of redistribution patterns and the semiconductor chip.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor package comprising:
    a substrate having a top surface on which a lead is disposed and a bottom surface opposite to the top surface;
    a semiconductor chip attached to the top surface of the substrate having an active surface on which a chip pad is disposed and a back surface opposite to the active surface;
    a redistribution pattern electrically connected to the chip pad and extending from the active surface to a lateral surface of the semiconductor chip; and
    an interconnector electrically connecting the redistribution pattern to the lead.

2. The semiconductor package of claim 1, wherein the redistribution pattern comprises a horizontal portion and a vertical portion, the horizontal portion disposed on the active surface of the semiconductor chip and electrically connected to the chip pad, the vertical portion disposed on the lateral surface of the semiconductor chip, extending from the horizontal portion, and adjacent to the lead.

3. The semiconductor package of claim 2, wherein the interconnector electrically connects the vertical portion of the redistribution pattern to the lead.

4. The semiconductor package of claim 3, wherein the interconnector comprises one of a solder bump and a stud bump.

5. The semiconductor package of claim 3, wherein the interconnector is formed by fusing the vertical portion of the redistribution pattern and the lead.

6. The semiconductor package of claim 1, wherein the substrate further comprises an insulator disposed on the top surface of the substrate to encapsulate the semiconductor chip, and an external connection terminal disposed on the bottom surface of the substrate.

7. The semiconductor package of claim 1, further comprising an adhesive inserted between the top surface of the substrate and the back surface of the semiconductor chip to attach the semiconductor chip to the top surface of the substrate.

8. A semiconductor package comprising:
    a substrate having a top surface on which a plurality of leads are disposed and a bottom surface opposite to the top surface;
    a semiconductor chip attached to the top surface of the substrate having an active surface on which a plurality of chip pads are disposed and a back surface opposite to the active surface; and
    a plurality of redistribution patterns electrically connected to the chip pad, each of the redistribution patterns including a horizontal portion extending on the active surface of the semiconductor chip and a vertical portion disposed on a lateral surface of the semiconductor chip,
    wherein each of the plurality of redistribution patterns is electrically connected to a corresponding one of the plurality of leads.

9. The semiconductor package of claim 8, further comprising a plurality of interconnectors, the interconnectors electrically connecting the vertical portions of the redistribution patterns to the leads.

10. The semiconductor package of claim 9, wherein the interconnectors comprise one of a solder bump and a stud bump.

11. The semiconductor package of claim 8, wherein each of the plurality of redistribution patterns is fused to the corresponding one of the plurality of leads.

12. The semiconductor package of claim 8, further comprising an insulator disposed on the top surface of the substrate so as to encapsulate the semiconductor chip, and a plurality of external connection terminals disposed on the bottom surface of the substrate.

13. The semiconductor package of claim 8, further comprising an adhesive disposed between the top surface of the substrate and the back surface of the semiconductor chip to adhere the semiconductor chip to the top surface of the substrate.

14. The semiconductor package of claim 8, further comprising an insulating layer disposed between the vertical portions of the plurality of redistribution patterns and the semiconductor chip.

* * * * *